(12) United States Patent
Hahn

(10) Patent No.: US 8,146,828 B2
(45) Date of Patent: Apr. 3, 2012

(54) METHOD FOR PRODUCING A CARD-TYPE DATA CARRIER, AND DATA CARRIER PRODUCED ACCORDING TO THIS METHOD

(75) Inventor: Roland Hahn, Olten (CH)

(73) Assignee: Trüb AG (CH)

( * ) Notice: Subject to any disclaimer, the term of this patent is extended or adjusted under 35 U.S.C. 154(b) by 73 days.

(21) Appl. No.: 12/319,532

(22) Filed: Jan. 8, 2009

(65) Prior Publication Data

US 2009/0194597 A1 Aug. 6, 2009

(30) Foreign Application Priority Data

Jan. 10, 2008 (EP) .................................... 08405006

(51) Int. Cl.
G06K 19/00 (2006.01)
G06K 19/02 (2006.01)
G06K 19/06 (2006.01)
B29C 65/00 (2006.01)

(52) U.S. Cl. ....... 235/487; 235/488; 235/492; 156/73.4; 156/182

(58) Field of Classification Search .................. 235/487, 235/488, 492; 156/73.4, 182
See application file for complete search history.

(56) References Cited

U.S. PATENT DOCUMENTS

| 5,851,854 | A | * | 12/1998 | Haghiri-Tehrani et al. | ... 438/118 |
| 6,881,605 | B2 | * | 4/2005 | Lee et al. | ...................... 438/106 |
| 2004/0112967 | A1 | * | 6/2004 | Krappe et al. | ................ 235/492 |
| 2006/0176181 | A1 | * | 8/2006 | Halope | ...................... 340/572.8 |
| 2007/0176273 | A1 | * | 8/2007 | Wolny | .......................... 257/679 |
| 2009/0000107 | A1 | * | 1/2009 | Koch et al. | ...................... 29/601 |
| 2009/0008022 | A1 | * | 1/2009 | Kiessling | ..................... 156/73.1 |
| 2009/0151150 | A1 | * | 6/2009 | Ayala et al. | ..................... 29/600 |

FOREIGN PATENT DOCUMENTS

| DE | 32 48 385 A1 | 6/1984 |
| DE | 19731737 | * 9/1998 |
| DE | 102 57 111 A1 | 7/2004 |
| JP | 11-175682 A | 7/1999 |
| WO | WO 2004/023386 A1 | * 3/2004 |

* cited by examiner

Primary Examiner — Michael G Lee
Assistant Examiner — Laura Gudorf
(74) Attorney, Agent, or Firm — Lerner, David, Littenberg, Krumholz & Mentlik, LLP

(57) ABSTRACT

For producing a card-type data carrier, an electronic module is inserted into a cutout of a semifinished product having at least one film. The cutout is produced such that an interspace remains between the periphery of the module and the cutout after the module has been inserted into the cutout. After the module has been inserted into the cutout, the at least one film is locally heated and densified around the module such that the at least one film closes the interspace. The film is preferably heated by means of a stamp, in particular of a sonotrode.

14 Claims, 2 Drawing Sheets

Figure 1:
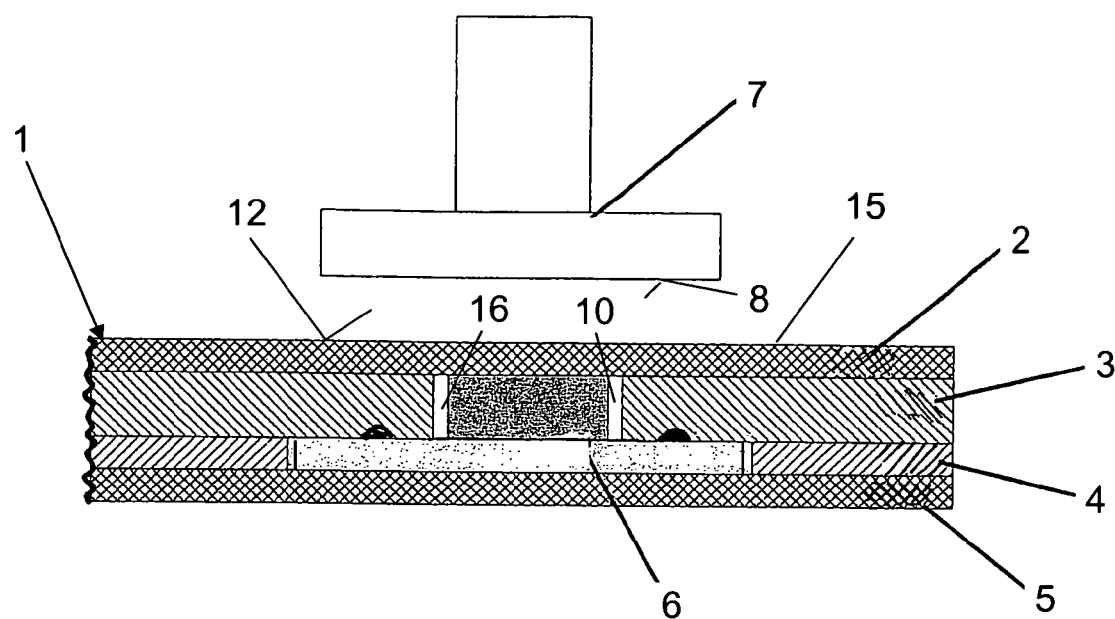

METHOD FOR PRODUCING A CARD-TYPE DATA CARRIER, AND DATA CARRIER PRODUCED ACCORDING TO THIS METHOD

The invention relates to a method for producing a card-type data carrier using a semifinished product having at least one film which is produced from plastic and which has a cutout and an electronic module arranged in said cutout, the cutout being produced such that an interspace remains between the periphery of the module and the cutout after the module has been inserted into the cutout. The invention additionally relates to a card-type data carrier produced according to this method.

Methods for producing card-type data carriers with an incorporated module have been disclosed by DE 102 57 111 A and WO 2005/063909. Card-type data carriers, for example credit cards, customer cards, access cards or else identity cards for passport control, for example, can be produced by this method. The module inserted into the cutout is a chip module, for example, which has module connections for electrical contact with an antenna situated in the card body. Such antennas are known per se and can be printed, etched, wound or laid, for example. In general, said antenna is situated between two films or layers of the card body. The module can have a circuit, for example, which is embodied as an RFID transponder and enables contactless identification. In principle, however, other modules and in particular electronic modules are also conceivable here.

In order that the module can be implanted into the card body, a film is provided with a cutout by stamping out the latter, for example. The implant is inserted into this cutout or stamped-out portion with a suitable device and electrically connected to the antenna. In addition, the module is fixed in the cutout by means of a suitable adhesive, for example. In order that this insertion or implantation can be effected simply and reliably, the cutout has to have a specific tolerance with respect to the module. The consequence of this tolerance is that with the module inserted, there is an interspace in the form of a gap between said module and the edge of the cutout. Such an interspace is disadvantageous, however, since it can cause an unacceptable flow during subsequent card production in the printing layout. In addition, such an interspace or gap can also cause a deformation in the card body. In order to avoid these disadvantages, a method has been disclosed in which the gap is filled with a suitable paste. Another method involves producing a semifinished product or inlay that is laminated with further films after the module has been inserted. However, both methods necessitate relatively complicated further steps for producing a card-type data carrier of the stated type.

The invention is based on the object of providing a method of the stated type which avoids the disadvantages mentioned. The object is achieved in a generic method by virtue of the fact that after the module has been inserted into the cutout, at least one film is locally heated and densified around the module, such that the film fills the interspace. Such heating and densification can be carried out significantly more simply and more rapidly than the above-mentioned production of a prelaminate or the filling with a paste. In particular, this heating and densification can be effected directly after the production of the antenna during in-line production. The method according to the invention can therefore essentially be carried out just as efficiently and cost-effectively as a method in which said interspace is not eliminated. A significant advantage of the method according to the invention is seen in the fact that the external format remains stable. The subsequent trimming required heretofore is therefore unnecessary. It is advantageous, moreover, that welded fittings like prelaminates can be processed further in a very simple manner since the module is embedded and the fittings are held together on account of the densification.

The method is particularly cost-effective when the film is heated and densified by a stamp that forms a welding tool. This welding tool is embodied as a sonotrode in particular, and thus heats the film by means of ultrasound. Experiments have shown that with the use of ultrasound, the quality is particularly high and in addition the film can be heated and densified very rapidly.

Preferably, according to one development of the invention, the module is inserted into at least two films bearing against one another. Each of these films has a corresponding cutout for the module. According to one development of the invention, two films are stamped out and, after the module has been inserted, an upper and a lower film are additionally placed onto these two films. This is followed by heating and densification around the module, such that the interspace or the gap closes around the module. As mentioned, heating and densification are effected only around the module. During the production of the data carrier, no distortion in the printing image can then be discerned in the region of the chip module.

The card-type data carrier according to the invention is characterized in that the card body is densified in the interior around the module. In this card-type data carrier, therefore, there is no interspace between the periphery of the module and the card body. In such a data carrier, a film can be welded with the module at its periphery. Such a data carrier is preferably multilayered.

Further features and advantages emerge from the dependent patent claims, the following description and the drawings.

Figure 2:
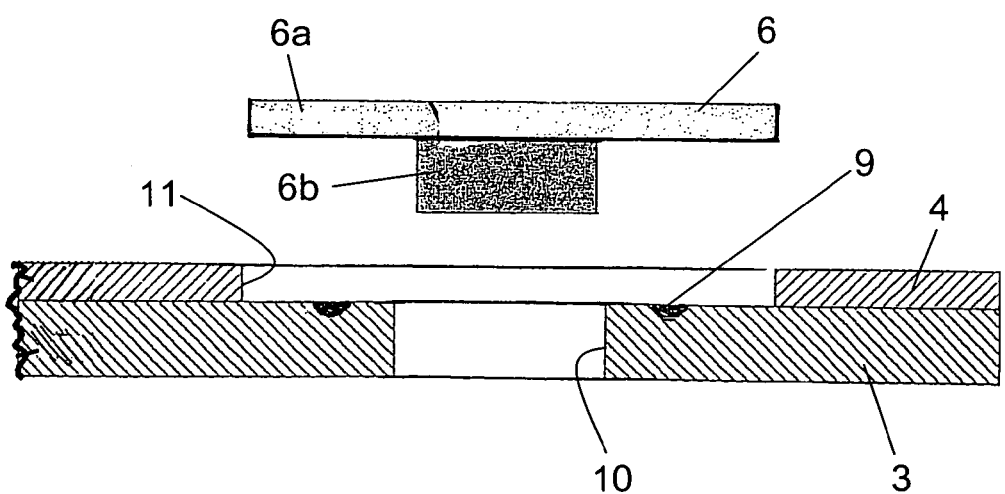
Figure 3:
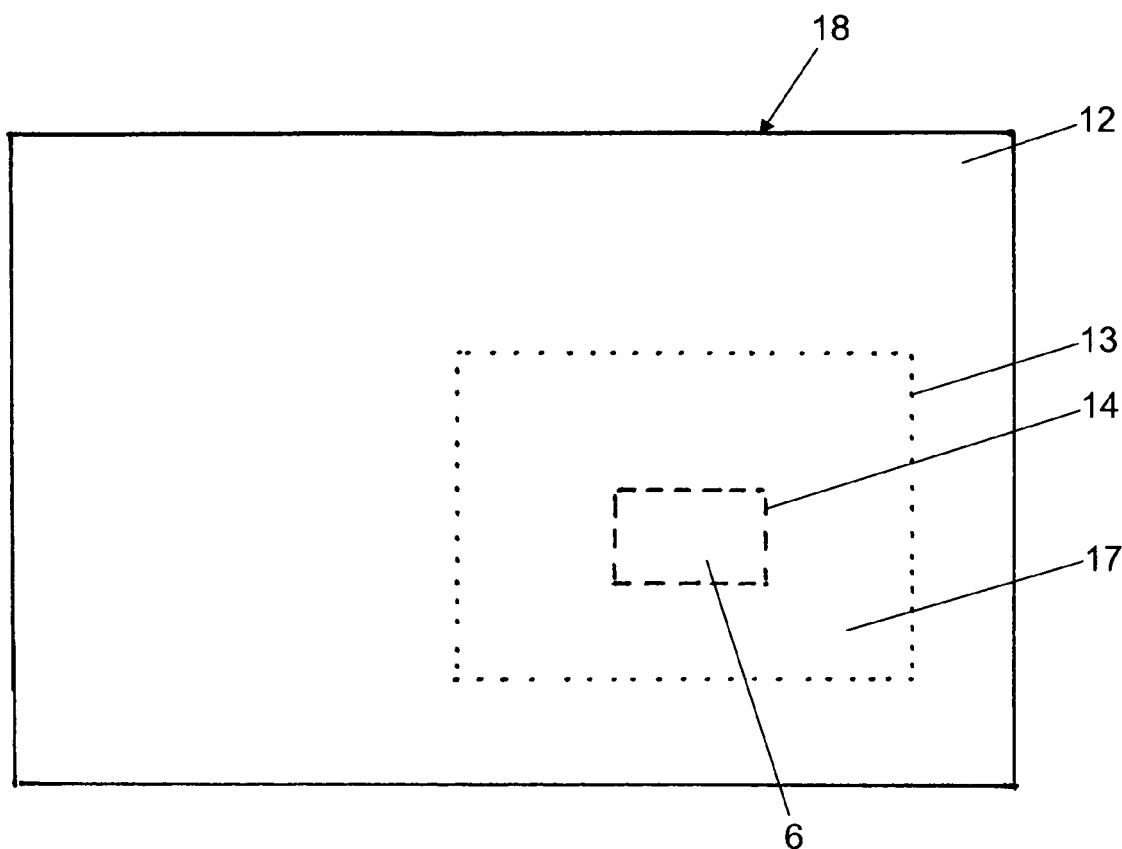

Exemplary embodiments of the invention are explained in more detail below with reference to the drawing, in which:

FIG. 1 schematically shows a section through part of a card-type semifinished product for a data carrier and also a tool for heating and densifying the card body locally around an inserted module, FIG. 2 schematically shows the insertion of a module into a semifinished product, and FIG. 3 schematically shows a plan view of the semifinished product.

Figure 4:
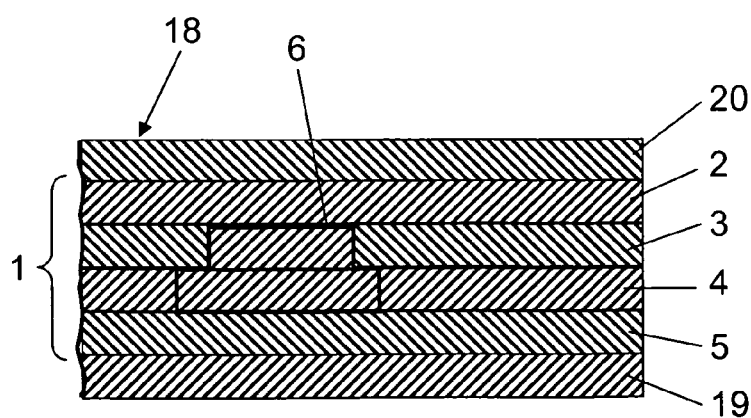

FIG. 4 schematically shows a section through part of a data carrier according to the invention.

FIG. 1 shows a portion of a card-type semifinished product 1 having a card body 15, into which an electronic module 6 is implanted. Such semifinished products 1 are also called "inlets" or "inlays". This module 6 is usually, but not necessarily, formed from a plate-type carrier 6a and a head 6b as in accordance with FIG. 2. The module 6 is a chip module, in particular. During implantation, this module 6 is electrically connected to an antenna 9. In addition, the module 6 is fixed in the card body 15 for example by means of a liquid adhesive, a hot melt adhesive or an adhesive film.

In the case of the semifinished product 1 shown, the module 6 is inserted into a first compensating film 3 and a second compensating film 4. The first compensating film 3 has a cutout 10, which is a rectangular or round stamped-out portion, for example, which receives the head 6b of the module 6. The second compensating film 4 has a larger cutout 11 corresponding to the plate-type carrier 6a. The cutout 10 is dimensioned such that after the module 6 has been inserted, an interspace 16 in the form of a gap is present between said module and the first compensating film 3, as is shown in FIG. 1. Such a gap can also be present in the cutout 11. The thickness of the module 6 corresponds to the sum of the two thicknesses of the compensating films 3 and 4.

The module 6 is inserted into the cutouts 10 and 11 as shown in FIG. 2. Afterwards, a lower film 5 is positioned on the second compensating film 4 and an upper film 2 is positioned on the compensating film 3, such that the arrangement in accordance with FIG. 1 is finally present. By means of a sonotrode 7, in accordance with FIG. 1, the card body 15 is then heated and densified in the region of the module 6. The region essentially corresponds to that of a planar front side 8 of the sonotrode 7. The sonotrode 7 is placed by the front side 8 onto an area 12 of the card body 15. The card body is heated and densified around the module 6 by the ultrasonic energy introduced into the card body 15. A suitable oscillation frequency preferably lies within the range of 20-40 kHz. The heated card body 15 thereby becomes flowable and thereby closes the interspace 16 in the form of a gap. Since the volume of the interspace 16 is comparatively small, the remaining deformations at the card body 15 are very small. The interspace 16 is therefore no longer present after this method step. What is essential is that this heating and densification can be effected very rapidly by means of the sonotrode 7. As a result, the customary fully automatic in-line process for producing a data carrier 18 is not slowed down, or is slowed down only to an insignificant extent. The heating and densification by means of said sonotrode 7 is merely an example. Heating and densification by means of a heating element or by means of hot air is also conceivable.

The card body 15 shown is composed of a plurality of layers 2-5. However, it can also be composed of just one layer. In particular, the topmost film 2 is not mandatory. The latter can therefore also be omitted.

The card body 15 and thus the films 2, 3, 4 and 5 are each composed of a suitable plastic, in particular a thermoplastic, as is customary in such data carriers 18.

Once the semifinished product 1 with the card body 15 has been produced, then it is laminated with two films 19 and 20, for example. FIG. 4 shows a section through part of the data carrier 18 that was produced by laminating a semifinished product 1 with the films 19 and 20. It is clear to the person skilled in the art that lamination can be performed with even further films (not shown here), in which case the latter can be printed, transparent or opaque.

FIG. 3 shows a plan view of the data carrier 18. The implanted module 6 is represented here by dashed lines 14 and the region 17 densified in the interior of the card body is represented by dotted lines 13. The densified region 17 is therefore rectangular here and surrounds the chip 6 in the form of a frame. It goes without saying that said region 17 can also be somewhat larger or smaller. However, it is in any event a partial region of the total area 12 of the data carrier 18. It goes without saying that the region 17 could also have a different form; by way of example, it could also be circular or oval.

LIST OF REFERENCE SYMBOLS

1 Semifinished product
2 Upper film
3 First compensating film
4 Second compensating film
5 Lower film
6 Module
6a Carrier
6b Head
7 Sonotrode
8 Front side
9 Antenna
10 Cutout
11 Cutout
12 Area
13 Line
14 Line
15 Card body
16 Interspace
17 Region
18 Data carrier
19 Film
20 Film

The invention claimed is:

1. Method for producing a card-type data carrier using a semifinished product having at least one film which is produced from plastic and which has a cutout and an electronic module arranged in said cutout, the cutout being produced such that an interspace remains between the periphery of the module and the cutout after the module has been inserted into the cutout, wherein after the module has been inserted into the cutout, the at least one film is locally heated and densified around the module, such that the at least one film closes the interspace, wherein the module is inserted in at least two films having a respective cutout for the module.

2. Method according to claim 1, wherein the at least one film is heated by means of a stamp.

3. Method according to claim 1, wherein the at least one film is heated by means of ultrasound.

4. Method according to claim 1, wherein after the module has been inserted, at least one further film is positioned on the at least one film.

5. Card-type data carrier having a card body and a module implanted into the card body, produced according to claim 1, wherein the card body is densified in the interior around the module.

6. Card-type data carrier according to claim 5, wherein the module is inserted in two films connected to one another.

7. Card-type data carrier according to claim 5, wherein the card-type data carrier is multilayered, and in that the module is covered by at least one film.

8. Method according to claim 1, wherein after the module has been inserted, two further films are positioned on the at least one film.

9. Card-type data carrier having a card body and a module implanted into the card body, produced according to a method for producing a card-type data carrier using a semifinished product having at least one film which is produced from plastic and which has a cutout and an electronic module arranged in said cutout, the cutout being produced such that an interspace remains between the periphery of the module and the cutout after the module has been inserted into the cutout, wherein after the module has been inserted into the cutout, the at least one film is locally heated and densified around the module, such that the at least one film closes the interspace, wherein the card body is densified in the interior around the module, wherein the module is inserted in two films connected to one another.

10. Card-type data carrier according to claim 9, wherein the card-type data carrier is multilayered, and in that the module is covered by at least one film.

11. Method for producing a card-type data carrier using a semifinished product having at least one film which is produced from plastic and which has a cutout and an electronic module arranged in said cutout, the cutout being produced such that an interspace remains between the periphery of the module and the cutout after the module has been inserted into the cutout, wherein after the module has been inserted into the cutout, the at least one film is locally heated and densified around the module, such that the at least one film closes the interspace,
    wherein after the module has been inserted, two further films are positioned on the at least one film.

12. Method according to claim 11, wherein the at least one film is heated by means of a stamp.

13. Method according to claim 11, wherein the at least one film is heated by means of ultrasound.

14. Method according to claim 11, wherein after the module has been inserted, at least one further film is positioned on the at least one film.

* * * * *